United States Patent
Adachi

(10) Patent No.: US 6,445,027 B2
(45) Date of Patent: Sep. 3, 2002

(54) METHOD OF MANUFACTURING ELECTRONIC COMPONENT HAVING CAPACITOR ELEMENT AND RESISTOR ELEMENT, METHOD OF MANUFACTURING SEMICONDUCTOR DEVICE, AND SEMICONDUCTOR DEVICE

(75) Inventor: Kiwamu Adachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/766,729

(22) Filed: Jan. 22, 2001

(30) Foreign Application Priority Data

Jan. 21, 2000 (JP) ........................................ 2000-012740

(51) Int. Cl.$^7$ ............................................ H01L 31/119
(52) U.S. Cl. ...................................... 257/300; 257/533
(58) Field of Search ........................... 257/533; 29/577; 357/51; 438/384; 437/51; 204/15

(56) References Cited

U.S. PATENT DOCUMENTS

| | | | | |
|---|---|---|---|---|
| 3,988,824 A | * | 11/1976 | Bodway | 29/577 |
| 4,251,326 A | * | 2/1981 | Arcidiacono et al. | 204/15 |
| 4,344,223 A | * | 8/1982 | Bulger et al. | 29/577 |
| 5,514,612 A | * | 5/1996 | Rao et al. | 437/51 |
| 5,618,749 A | * | 4/1997 | Takahashi et al. | 438/384 |

* cited by examiner

Primary Examiner—David Nelms
Assistant Examiner—Thinh Nguyen
(74) Attorney, Agent, or Firm—Sonnenschein, Nath & Rosenthal

(57) ABSTRACT

A method of manufacturing an electronic component having a capacitor element and a resistor element, in which such capacitor element and such resistor element are individually formed in the material layer (for example, a tantalum oxide film formed by the CVD process) by locally subjecting such material layer to different kinds of treatment, such as nitriding and oxidation, is provided. There is also provided a method of manufacturing a semiconductor device having a capacitor element and a resistor element, in which such capacitor element and such resistor element are individually formed in the same material layer by locally subjecting such material layer to different kinds of treatment. There is still also provided a semiconductor device having a capacitor element and a resistor element thus formed. According to the present invention, a material excellent as that for capacitor element and also suitable for other applications is used, and the material is effectively converted into other materials suitable for the capacitor element and resistor element, respectively. Thus the present invention can add value of such material, and allows a positive attitude to be taken in facility investment for such material and introduction of other similar new materials.

14 Claims, 5 Drawing Sheets

METHOD OF MANUFACTURING ELECTRONIC COMPONENT HAVING CAPACITOR ELEMENT AND RESISTOR ELEMENT, METHOD OF MANUFACTURING SEMICONDUCTOR DEVICE, AND SEMICONDUCTOR DEVICE

BACKGROUND OF THE INVENTION

1. Field of the Invention

The present invention relates to a method of manufacturing an electronic component having a capacitor element and a resistor element, a method of manufacturing a semiconductor device in accordance with the manufacturing method, and a semiconductor device obtainable by such method of manufacturing a semiconductor device. More specifically, the present invention is to make improvements in formation processes of a capacitor element and a resistor element, and can beneficially be applied to the field of electronic component or semiconductor device having a capacitor provided between electrodes made of a metal or the like, or having a resistor element provided between electrodes made of a metal or the like.

2. Description of the Related Art

A variety of electronic components having a capacitor element, or having both of a capacitor element and a resistor element have been known. A typical example thereof relates to a semiconductor device, such as LSI, having a capacitor element and a resistor element as passive elements.

An example of a conventional semiconductor device is shown in FIG. 10. On a substrate 3 made of, for example, silicon, interlayer insulating films 41, 42 are formed as stacked in this order, further thereon a first wiring 5 is formed, and still further thereon a second wiring 8 is formed as interposed by an inter-wiring insulating film 7.

In the conventional example shown now in the figure, a resistor element 2a is formed on the lower interlayer insulating film 41, where such resistor element 2a being connected to electrodes made of the same layer as the first electrode 5 so as to function as a resistor. On the other hand, a capacitor element 1a being a dielectric material is formed on the upper interlayer insulating film 42, where the capacitor element 1a is sandwiched by the first wiring 5 as a lower electrode and the second wiring 6 as an upper electrode, to thereby form a capacitor.

It has been a general practice that the capacitor element 1a and the resistor element 2a were formed independently using separate material layers as shown in the figure.

In the field of semiconductor device typified by LSI, recent trends relate to development of a variety of dielectric materials having a high dielectric constant in pursuit of further upgrading the degree of integration or capacitance of the capacitor element. Development activities are centered round dielectric materials such as $Ta_2O_5$, PZT, BST, STO or the like, and among which $Ta_2O_5$ (tantalum pentoxide) has already reached a phase of practical use, and introduction thereof into devices has already started.

By the way, SiN (silicon nitride), which is a typical conventional material for composing a capacitor element, has been considered to be beneficial in terms of load factor relative to facility investment, and in terms of additional value in the introduction into processes, since SiN is also applicable to various fields other than capacitor element such as device isolating material, protective film and so forth.

On the contrary, it is still not clear whether the all of the foregoing newly developed materials are always suitable for applications other than capacitor element. It may be sure that materials excellent as those for capacitor element are intrinsically valuable enough for memory LSIs whose additional value is defined by performance of the capacitor element per se. Development of such materials, however, does not always produce additional value when the materials are intended for use in electronic component such as a system LSI device, a mixed-signal LSI device and an MMIC device, in which the capacitor element is assumed as a part of passive elements. Thus it is not strictly meaningless to hesitate introducing such new materials when considering an overall additional value including improved capacitor performance over necessary process cost and facility introduction cost.

Thus the present inventor has long been investigating into a material excellent as that for the capacitor element and suitable for other applied fields, and also into whether it is possible to provide a simple technique based on a proper use of such materials.

SUMMARY OF THE INVENTION

It is therefore an object of the present invention to find out a material excellent as that for the capacitor element and suitable for other applicable fields, and to provide a technique for obtaining an electronic component in which such material can fully exhibit its advantage in such applications.

To accomplish the foregoing object, the present invention employs a specific material which can produce both of a capacitor element and a resistor element when locally subjected to different kinds of treatment.

The present invention was proposed basically in the course of searching a material suitable not only for a capacitor element but also for applications other than the capacitor element, where such material should be made applicable to a plurality of applications by one or more proper treatment processes, and where an application other than the capacitor element being assumed as a resistor element. The present invention is based on findings the present inventor obtained from the above search efforts.

The present invention is to provide a method of manufacturing an electronic component having a capacitor element and a resistor element, and is characterized in that the capacitor element and the resistor element are individually formed in the same material layer initially having a single composition by locally subjecting the material layer to different kinds of treatment. Also the present invention is to provide a method of manufacturing an electronic component having a capacitor element and a resistor element, and is characterized in that the capacitor element and the resistor element are individually formed by introducing into a tantalum oxide film oxygen within an area for forming the capacitor element, and nitrogen within an area for forming the resistor element, respectively.

A method of manufacturing a semiconductor device of the present invention is to provide a method of manufacturing a semiconductor device having on a single substrate a capacitor element and a resistor element, and is characterized in that the capacitor element and the resistor element are individually formed in the same material layer initially having a single composition by locally subjecting said material layer to different kinds of treatment. Also the present invention is to provide a method of manufacturing a semiconductor device having a capacitor element and a resistor element, and is characterized in that the capacitor element and the resistor element are individually formed by introducing into a tantalum oxide film oxygen within an area for forming the capacitor element, and nitrogen within an area for forming the resistor element, respectively.

Furthermore, a semiconductor device of the present invention relates to the one having a capacitor element and a resistor element in a single substrate, and is characterized in that the capacitor element and the resistor element are individually formed in the same material layer initially having a single composition by locally subjecting said material layer to different kinds of treatment.

According to the present invention, the capacitor element and the resistor element are formed by separate treatments on a single material layer, that is, one material is used not only for the capacitor but also for the resistor. This can realize additional value of the development and ensure an efficient device formation.

For instance, Ta (tantalum) which has been developed as a typical high dielectric material is known to become an insulating material after being oxidized, and to become an electro-conductive material suitable for use as a resistor after being nitrided. Based on such property, forming process of tantalum compound ($Ta_2O_5$) layer can add its value (performance/cost ratio) by forming a capacitor element and the resistor element in the same layer. Such a case is also advantageous in that shrinking, downsizing and higher integration of the device since a tantalum nitride resistor can achieve high sheet resistance relatively easier than a conventional resistor does.

Similar effects are obtainable also with other materials provided that they can be a capacitor element and a resistor element depending on the treatments.

According to the present invention, a material excellent as that for capacitor element and also suitable for other applications is used, and the material is effectively converted into other materials suitable for the capacitor element and resistor element, respectively. Thus the present invention can add further value of such material, and allows a positive attitude to be taken in facility investment for such material and introduction of other similar new materials.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENT

An embodiment of the present invention will be explained, and preferred examples of the present invention will further be explained referring to the attached drawings. It is however to be understood that the present invention is by no means limited to those examples in the description and drawings below.

In an embodiment of the present invention, the material layer initially having a single composition can be defined as a tantalum oxide film, and the capacitor element and resistor element may be made of tantalum pentoxide and tantalum oxynitride, respectively.

The method of the present invention can be designed so as to introduce oxygen into an area for forming the capacitor element, and nitrogen into an area for forming the resistor element so as to form the elements individually. The introduction of oxygen and nitrogen can be effected by the plasma doping method. Such introduction of oxygen is effected using $O_2$, $O_3$, $N_2O$ or $H_2O_2$ (any combination of two or more thereof also allowable), and such introduction of nitrogen is effected using gas of $N_2$, $NH_3$ or $N_2H_2$ (any combination of two or more thereof also allowable).

In an embodiment of the present invention, the capacitor element and the resistor element can be passive elements. In this case, it is preferable to form the capacitor element and the resistor element, both of which being passive elements, after formation of active elements is completed.

The following paragraphs explain specific and preferred examples of the present invention aimed at selecting a material layer allowing a simplest formation process of the capacitor element and resistor element in the same layer, and adopting and optimizing oxidizing means and nitriding means, all of which resulted in success.

EXAMPLE 1

In this example, the present invention was applied to a semiconductor device as an electronic component having a capacitor element and a resistor element, and in particular to a highly shrunk and integrated LSI. In particular in this example, a capacitor element of an MIM-structure (metal/dielectric material being an insulator/metal) and a resistor element are formed together in the same material layer (a layer obtained by the same film-forming process) although timing of the manufacturing of both elements is not concomitant. The both elements (i.e., the capacitor element and resistor element) can be arranged so as to be connected with each other only via a second electrode.

Figure 1:
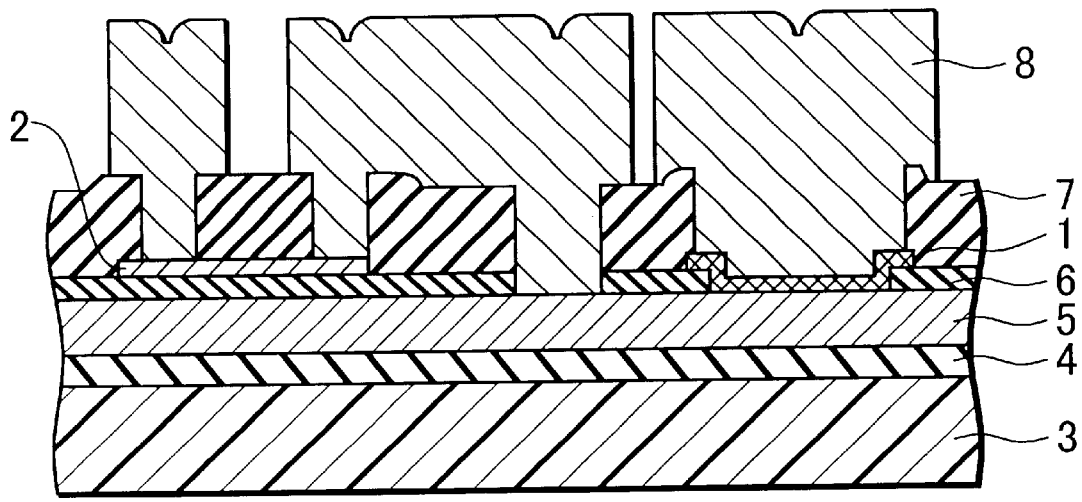
FIG. 1 is a sectional view showing a structure of an electronic component (semiconductor device) according to Example 1 of the present invention.

That is, in a semiconductor device according to the example of the present invention as shown in FIG. 1, an interlayer insulating film 4 and a first wiring 5 are formed on a substrate 3 made of, for example, silicon, as stacked in this order, and further thereon a second wiring 8 is formed as interposed by an interlayer insulating film 6 and an inter-wiring insulating film 7. A capacitor element 1 being a dielectric material layer is formed so as to cover an opening provided to the interlayer insulating film 6, which is sandwiched by the first wiring 5 as a lower electrode and the second wiring 8 as an upper electrode, to thereby form a capacitor.

A resistor element 2 is formed on the interlayer insulating film 6. Both of the resistor element 2 and the capacitor element 1 being the dielectric material layer are connected to the second wiring 8. That is, in this example, both elements are connected only through the second wiring 8.

The resistor element 2 is formed by a local treatment of a material layer to which the capacitor element 1 being a dielectric material is also formed. That is, the interlayer insulating film 6 is formed and patterned to provide an opening in which the capacitor element will be formed, a material layer for forming the resistor element 2 and the capacitor element 1 [tantalum oxide layer formed by the CVD (chemical vapor deposition) process] is then formed, and a portion of the material layer is subjected to nitriding to thereby obtain the resistor element 2, and another portion of which is subjected to oxidation to thereby obtain the capacitor element 1. Specific methods for forming the elements will comply with those described later in conjunction with example 2.

Basically in this example, a material layer is defined as a tantalum oxide layer formed by the CVD process, which is followed by selective doping of oxygen into an area for forming the capacitor element to thereby promote further oxidation towards tantalum pentoxide, and by selective doping of nitrogen into an area for forming the resistor element to thereby convert it into tantalum oxynitride. Now opening pattern of the inter-wiring insulating film (made of silicon oxide layer in this example), in which the tantalum oxide layer and upper electrode (wiring) connect with each other, is devised so as to improve the performance/cost ratio.

EXAMPLE 2

Also in this example, the present invention is applied to a semiconductor device as an electronic component having a capacitor element and a resistor element, similarly to example 1, and in particular to a highly shrunk and integrated LSI.

Figure 2:
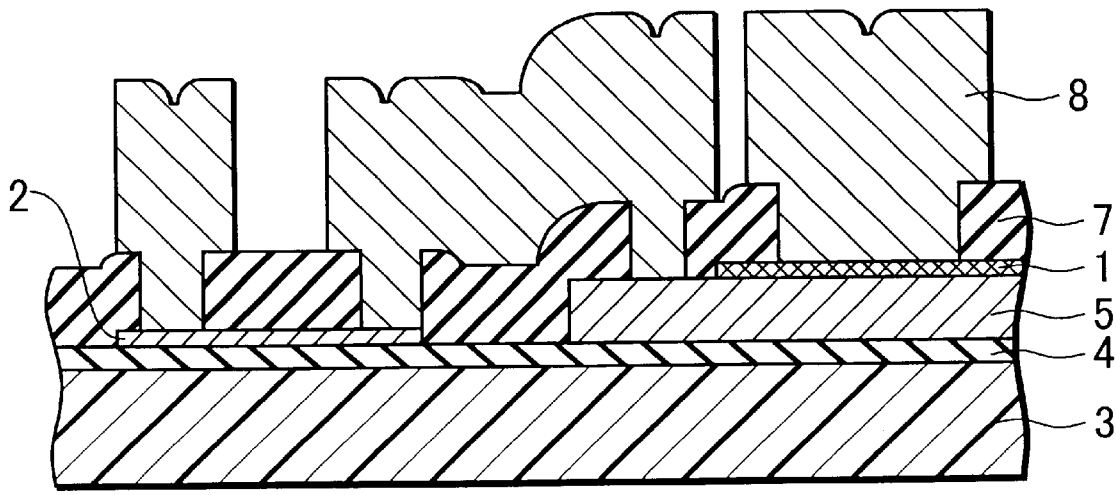
FIG. 2 is a sectional view showing a structure of an electronic component (semiconductor device) according to Example 2 of the present invention.

An exemplary structure of a semiconductor device according to the second example of the present invention is shown in FIG. 2. As illustrated in the figure, an interlayer insulating film 4 is formed on a substrate 3 made of, for example, silicon, a resistor element 2 and a first wiring 5 are formed thereon, and further thereon a second wiring 8 is formed as interposed by an inter-wiring insulating film 7. A capacitor element 1 being a dielectric material is formed on the first wiring 5 so as to occupy a wider area than an opening provided to the inter-wiring insulating film 7, and sandwiched by the first wiring 5 as a lower electrode and the second wiring 8 as an upper electrode, to thereby form a capacitor.

The resistor element 2 is formed by treating the material layer same as that for the capacitor element 1. A method of obtaining the structure of this example will be detailed hereinafter referring to FIGS. 3 to 9.

In the semiconductor device of this example, the capacitor element and the resistor element are passive elements, and active elements have already been formed elsewhere.

Figure 3:
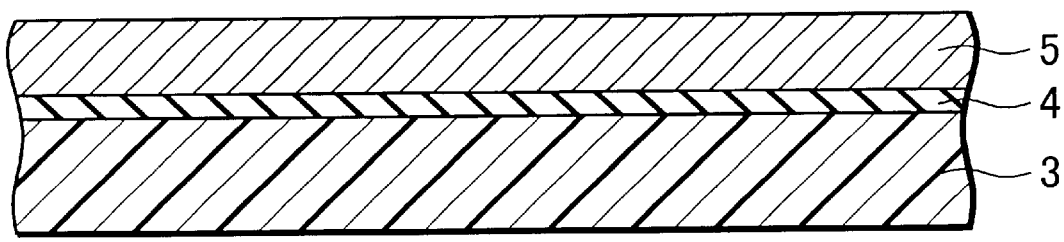
FIG. 3 is a sectional view showing a process step for manufacturing the electronic component of the Example 2.

That is, what is illustrated in FIG. 3 is a state in which formation of the active elements (not shown) has already been completed, and the first wiring 5 is formed. There is only shown areas for forming the capacitor element and the resistor element.

Figure 4:
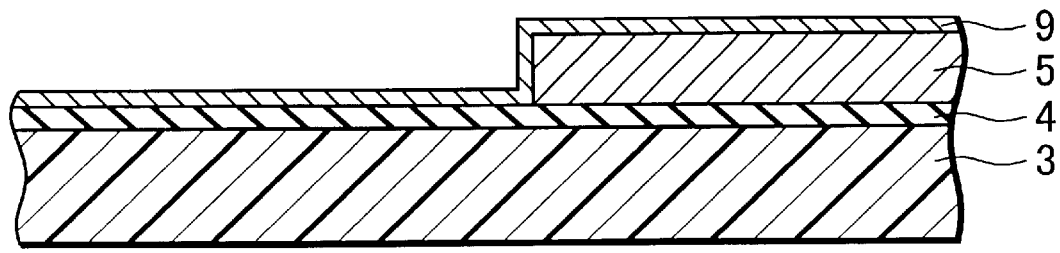
FIG. 4 is a sectional view showing a process as continued from FIG. 3.

Next, the first wiring 5 is selectively removed in the area for forming the resistor element. A tantalum oxide film 9 is then formed as a thin film (FIG. 4). The tantalum oxide film 9 is formed by the CVD process.

Figure 5:
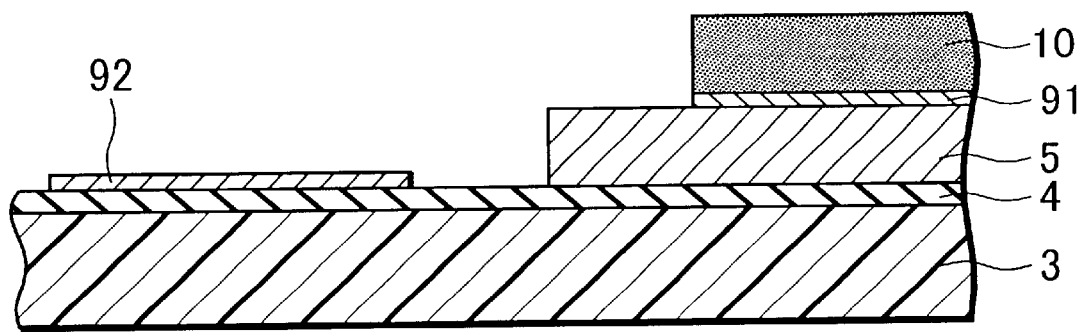
FIG. 5 is a sectional view showing a process as continued from FIG. 4.

The tantalum oxide film 9 is then selectively removed so as to leave a capacitor element portion 91 and a resistor element portion 92. The capacitor element portion 91 then covered with a resist layer 10 (FIG. 5).

Figure 6:
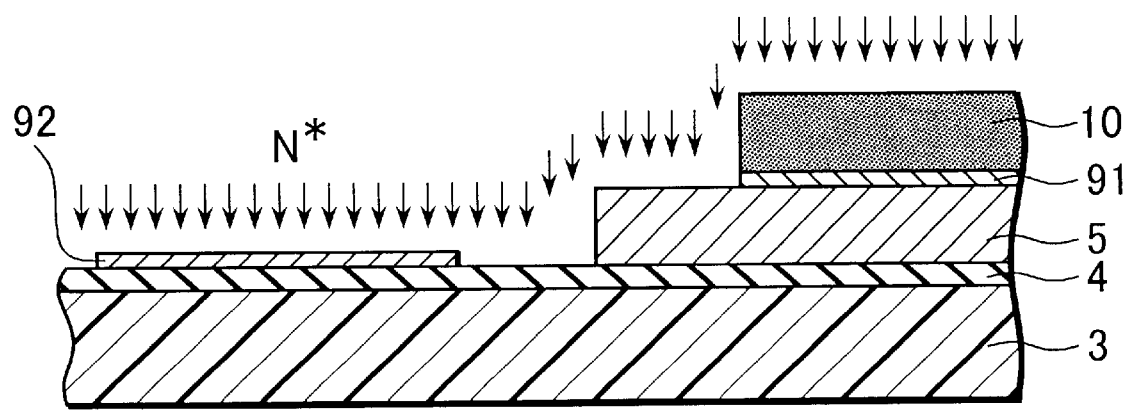
FIG. 6 is a sectional view showing a process as continued rom FIG. 5.
Figure 7:
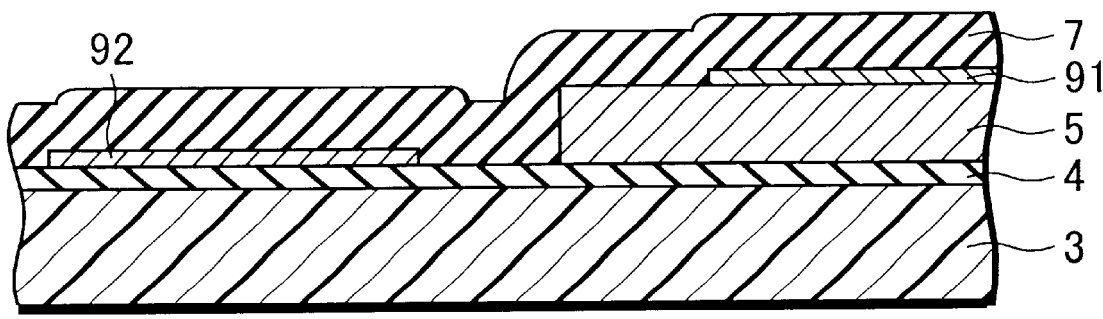
FIG. 7 is a sectional view showing a process as continued rom FIG. 6.

In order to form the resistor element, the resistor element portion 92 is then introduced with nitrogen to convert the tantalum oxide film into a tantalum oxynitride film locally in that portion (FIG. 6). Nitrogen is now not introduced into the capacitor element portion 91 covered with the resist layer 10. Nitrogen is considered to attack the tantalum oxide layer in the resistor element portion 92 in a form of radical.

The resist layer 10 protecting the capacitor element portion 91 is then removed, the inter-wiring insulating film 7 is formed on the entire surface (FIG. 7), and the film is then opened in a portion corresponding to the capacitor element portion 91.

Figure 8:
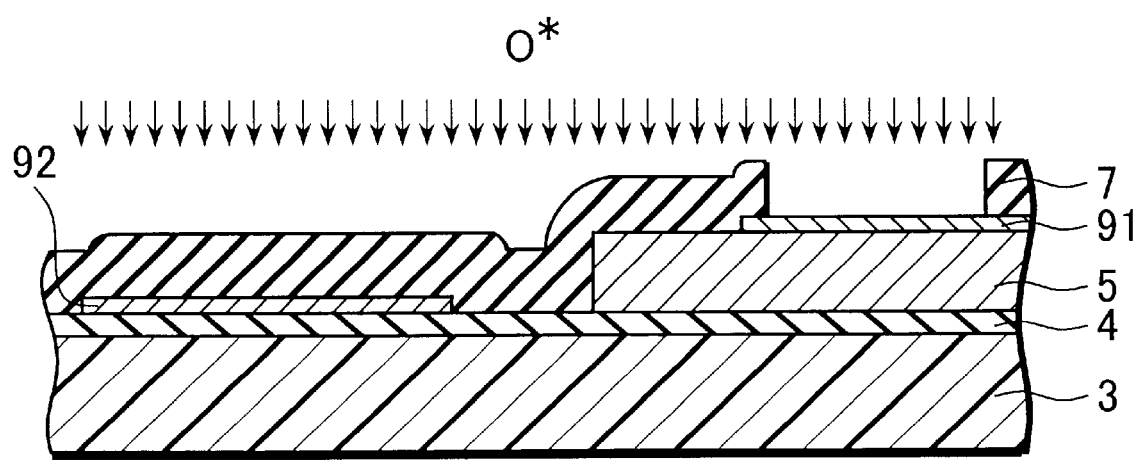
FIG. 8 is a sectional view showing a process as continued from FIG. 7.

The, capacitor element portion 91 is then introduced with oxygen to convert the tantalum oxide film into a tantalum pentoxide film locally in that portion (FIG. 8). Since oxygen is introduced only through the opening provided to the inter-wiring insulating film 7, oxidation proceeds only in the capacitor element portion 91 and exerts no affection on the resistor element portion 92 covered with the inter-wiring insulating film 7. Nitrogen is considered to attack the tantalum oxide film in the capacitor element portion 91 in a form of radical. Thus the formation of the capacitor element 1 and the resistor element 2 is completed.

Figure 9:
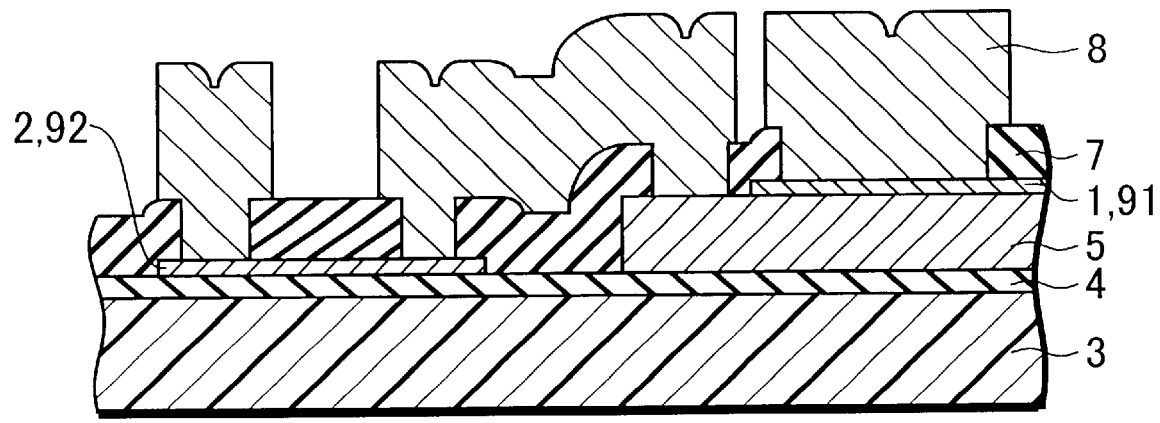
FIG. 9 is a sectional view showing a process as continued from FIG. 8.
Figure 10:
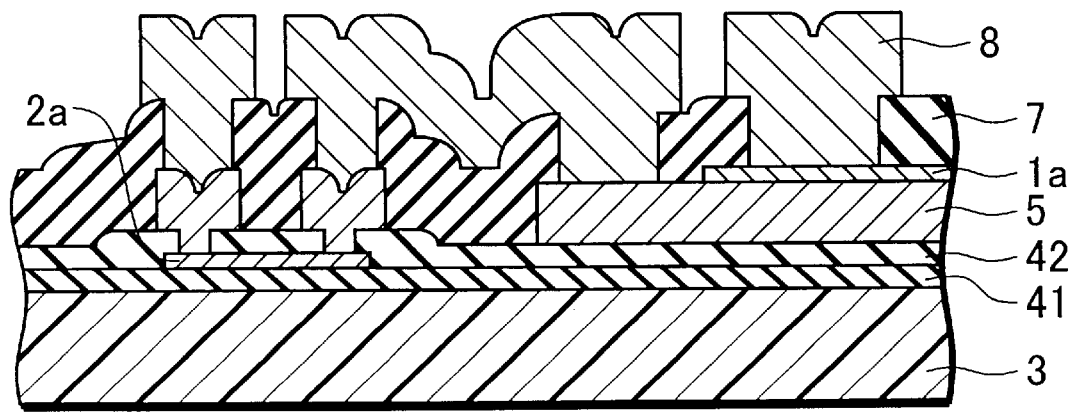
FIG. 10 is a sectional view showing a conventional structure of an electronic component.

Next, the second wiring 8 is formed to obtain a structure shown in FIG. 9. This corresponds to the final structure already shown in FIG. 2.

The tantalum oxide film 9 from which the individual elements 1, 2 are made is generally formed by the CVD process, and is preferably an oxygen-deficient tantalum oxide film containing a less amount of impurities such as carbon, water and hydrogen, rather than an exactly stoichiometric tantlum pentoxide.

The nitriding for forming the resistor element 2, as shown in FIG. 6, is preferably effected by plasma irradiation using any one of nitrogen ($N_2$), ammonia ($NH_3$) and hydrazine ($N_2H_2$), or any mixture thereof. While nitrogen or ammonia can generally give a good result, hydrazine herein allows most effective nitriding by virtue of synergistic effects of reducing action and nitriding action to tantalum oxide. Hydrazine, however, needs special care due to its toxicity and difficulty in handling.

Plasma source may be of any type, and may be plasma excited by a parallel plate type, ICP (induction coupled plasma), TCP (transmission coupled plasma) or a helicon wave plasma. It is more effective and preferable to employ a system capable of producing high density plasma and of applying a certain level of bias.

The oxidation for forming the capacitor element 1, as shown in FIG. 8, is preferably effected by plasma irradiation using any one of oxygen ($O_2$), ozone ($O_3$), nitrous oxide ($N_2O$), hydrogen peroxide ($H_2O_2$) or any mixture thereof. Among which, ozone can exert effects simply by irradiation since the species is intrinsically active. Ozone irradiation or high density oxygen plasma irradiation may be preferable whenever possible.

In a specific embodiment of the present invention, the tantalum oxide film 9 of 30 nm thick is formed by the CVD process (FIG. 4), and an ammonia plasma is irradiated thereto for 14 minutes using a parallel plate plasma treatment apparatus (FIG. 6). The film, which was almost an insulating material after CVD treatment, is thus converted into a film having a sheet resistance of approx. 8 to 10 k$\Omega$/□. On the other hand, the same tantalum oxide film 9 can achieve a unit capacity of 7 fF/$\mu m^2$ and a leak current density of 1E-8 A/cm$^2$ (at 5 V) when irradiated with ozone (O$_3$) for 10 minutes. As for materials available for individual portions, those for the individual interlayer insulating films include plasma TEOS-SiO$_2$ (or NSG (non-doped silicate glass)), PE-TEOS-SiO$_2$, or the like; and those for the first and second wirings include aluminum (Al), aluminum-silicon alloy (Al—Si) and aluminum-copper alloy (Al—Cu). The individual portions can be formed according to usual process conditions.

As has been described in the above, value of tantalum oxide application technique is improved by embodying the present invention, and in particular value of the tantalum oxide CVD process is improved. Thus the present invention adds value of a material excellent as that for the capacitor element and also available for other application such as the resistor element; and allows a positive attitude to be taken in facility investment for such material and introduction of other new materials. The present invention is also beneficial in that obtaining a resistor element relatively higher in the resistivity than the conventional resistor, for example, a polysilicon resistor, in a simple way. This is advantageous in higher integration since the resistor element can have a smaller occupied area. It is also beneficial in that reducing parasitic component, simplifying the constitution and facilitating the circuit design since the resistor element can be formed using the same material as that for forming other passive elements such as a capacitor element and an induction element.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method of manufacturing an electronic component having a capacitor element and a resistor element, comprising:

forming individually the capacitor element and the resistor element in a material layer having a single composition of a tantalum oxide (Ta$_x$O$_y$) compound, where x and y are integers by locally subjecting the material layer to different kinds of a CVD process treatment to ensure that the resistor comprises tantalum oxynitride deposited in a precisely controlled thickness.

2. The method of claim 1, wherein the material layer includes a tantalum oxide layer;

the capacitor element comprises tantalum pentoxide; and the resistor element comprises tantalum oxynitride.

3. A method of manufacturing an electronic component, the component further including a capacitor and a resistor, comprising:

forming the capacitor and resistor individually by introducing into a tantalum oxide (Ta$_x$O$_y$) film, where x and y are integers, oxygen within an area for forming the capacitor, and nitrogen within an area for forming the resistor, the resistor further comprising tantalum oxynitride formed by depositing the tantalum oxynitride in a substantially uniform thickness; and wherein the process for manufacturing the electronic component is by a CVD process.

4. The method of claim 3, wherein the introduction of oxygen and nitrogen is by plasma doping.

5. The method of claim 4, further comprising introducing O$_2$, O$_3$, N$_2$O, or H$_2$O$_2$ to the area where the capacitor is to be formed; and introducing N$_2$, NH$_3$, and N$_2$H$_2$ to the area where the resistor is to be formed.

6. A method of manufacturing a semiconductor having a capacitor and a resistor on a single substrate, comprising:

forming individually the capacitor and the resistor in a material layer having a single composition of a tantalum oxide compound (Ta$_x$O$_y$) where x and y are integers, by locally subjecting the material layer to different kinds of treatment; and forming the resistor with a tantalum oxynitride deposited in a CVD process to ensure that the thickness is precisely controlled.

7. The method of claim 6, wherein the material layer includes a tantalum oxide layer;

the capacitor element comprises tantalum pentoxide; and the resistor element comprises tantalum oxynitride.

8. The method of claim 6, wherein the capacitor and resistor are passive elements, and are formed after formation of active elements.

9. A method of manufacturing a semiconductor having a capacitor and a resistor, wherein the capacitor and resistor are individually formed by introducing into a tantalum oxide film (Ta$_x$O$_y$), where x and y are integers, oxygen within an area for forming the capacitor, and nitrogen within an area for forming the resistor, and the resistor comprises tantalum oxynitride formed by a CVD process to ensure that the thickness is precisely controlled.

10. The method of claim 9, wherein the introduction of oxygen and nitrogen is by plasma doping.

11. The method of claim 9, further comprising introducing O$_2$ O$_3$, N$_2$O, or H$_2$O$_2$ to the area where the capacitor is to be formed; and introducing N$_2$, NH$_3$, and N$_2$H$_2$ to the area where the resistor is to be formed.

12. A semiconductor device having a capacitor and a resistor, wherein the capacitor and the resistor are individually formed in a material layer having a single composition by locally subjecting the material layer to different kinds of treatment; and the resistor comprises tantalum oxynitride.

13. The semiconductor of claim 12 wherein the material layer includes a tantalum oxide layer;

the capacitor element comprises tantalum pentoxide; and the resistor element comprises tantalum oxynitride.

14. The semiconductor of claim 12, wherein the capacitor and resistor are passive elements.

* * * * *